US012800626B2

United States Patent
Shewmon

(12) United States Patent
(10) Patent No.: US 12,800,626 B2
(45) Date of Patent: Nov. 17, 2026

(54) BANDWIDTH BY TUNING RELATIVE CONDUCTOR SIZE IN A VERTICAL SLIT CONDUCTOR

(71) Applicant: Allegro MicroSystems, LLC, Manchester, NH (US)

(72) Inventor: Nathan Shewmon, Braunschweig (DE)

(73) Assignee: Allegro MicroSystems, LLC, Manchester, NH (US)

( * ) Notice: Subject to any disclaimer, the term of this patent is extended or adjusted under 35 U.S.C. 154(b) by 147 days.

(21) Appl. No.: 18/748,201

(22) Filed: Jun. 20, 2024

(65) Prior Publication Data

US 2025/0389759 A1 Dec. 25, 2025

(51) Int. Cl.
*G01R 19/25* (2006.01)
*G01R 15/20* (2006.01)
*G01R 19/00* (2006.01)

(52) U.S. Cl.
CPC ....... *G01R 19/2513* (2013.01); *G01R 15/202* (2013.01); *G01R 15/207* (2013.01); *G01R 19/0092* (2013.01)

(58) Field of Classification Search
CPC ............... G01R 19/00; G01R 19/0084; G01R 19/0092; G01R 19/25; G01R 19/2513; G01R 15/00; G01R 15/14; G01R 15/20; G01R 15/202
USPC ....................................................... 324/76.11
See application file for complete search history.

(56) References Cited

U.S. PATENT DOCUMENTS

| | | | |
|---|---|---|---|
| 3,647,963 | A | 3/1972 | Bailey |
| 4,757,420 | A | 7/1988 | Saletta et al. |
| 4,820,961 | A | 4/1989 | McMullin |
| 4,853,604 | A | 8/1989 | McMullin et al. |

(Continued)

FOREIGN PATENT DOCUMENTS

| | | | | |
|---|---|---|---|---|
| CN | 110957088 A | * | 4/2020 | ............... G01K 7/22 |
| CN | 111033276 W | | 4/2020 | |

(Continued)

OTHER PUBLICATIONS

Gojdka et al. "Biased AMR sensor with monolithically integrated NdFeB magnets" Oct. 2025, 6 pages.

(Continued)

*Primary Examiner* — Hoai-An D. Nguyen
(74) *Attorney, Agent, or Firm* — Daly, Crowley, Mofford & Durkee, LLP.

(57) ABSTRACT

A system comprising: a conductor having a first through-hole and a second through-hole formed therein, the first and second through-holes being arranged to define a first leg, a second leg, and a third leg of the conductor, the first leg having a first width, the second leg having a second width that is substantially equal to the first width, and the third leg having a third width, the second leg being disposed between the first through-hole and the second through-hole, the first leg being disposed across the first through-hole from the second leg, and the third leg being disposed across the second through-hole from the second leg; and a current sensor that is disposed in the first through-hole, the current sensor being arranged to measure a level of electrical current through the conductor, wherein a ratio between the first width and the third width is in the range of 0.45-0.60.

35 Claims, 20 Drawing Sheets

(56) References Cited

U.S. PATENT DOCUMENTS 5,041,780 A 8/1991 Rippel
5,841,274 A 11/1998 Masreliez et al.
6,300,617 B1 10/2001 Daughton et al.
6,356,068 B1 3/2002 Steiner et al.
6,512,359 B1 1/2003 Tamai et al.
6,583,613 B1 6/2003 Hohe et al.
7,476,816 B2 1/2009 Doogue et al.
7,598,601 B2 10/2009 Taylor et al.
7,746,056 B2 6/2010 Stauth et al.
7,816,905 B2 10/2010 Doogue et al.
7,923,996 B2 4/2011 Doogue et al.
7,936,164 B2 5/2011 Doogue et al.
8,030,918 B2 10/2011 Doogue et al.
8,080,994 B2 12/2011 Taylor et al.
8,447,556 B2 5/2013 Friedrich et al.
8,542,010 B2 9/2013 Cesaretti et al.
8,680,846 B2 3/2014 Cesaretti et al.
8,692,546 B2 4/2014 Cesaretti et al.
8,818,749 B2 8/2014 Friedrich et al.
8,847,590 B2 9/2014 Flock et al.
8,896,295 B2 11/2014 Friedrich et al.
8,907,669 B2 12/2014 Petrie
9,081,041 B2 7/2015 Friedrich et al.
9,151,807 B2 10/2015 Friedrich et al.
9,201,122 B2 12/2015 Cesaretti et al.
9,299,915 B2 3/2016 Milano et al.
9,411,025 B2 8/2016 David et al.
9,557,352 B2 1/2017 Akimoto et al.
9,620,705 B2 4/2017 Milano et al.
10,065,131 B2 * 9/2018 Buttridge ............... B01D 3/163
10,333,055 B2 6/2019 Milano et al.
10,345,343 B2 7/2019 Milano et al.
10,481,181 B2 11/2019 Bussing et al.
10,761,120 B2 9/2020 Feucht et al.
10,884,031 B2 1/2021 Vuillermet et al.
10,908,190 B2 2/2021 Bussing et al.
11,047,884 B2 6/2021 Shimizu
11,150,273 B2 10/2021 Liu et al.
11,226,382 B2 1/2022 Augendre et al.
11,320,466 B1 5/2022 Briano et al.
11,395,402 B2 7/2022 Sutono
11,555,832 B2 1/2023 Friedrich et al.
11,561,112 B2 1/2023 Briano et al.
11,656,250 B2 5/2023 Vuillermet et al.
11,768,229 B2 9/2023 Boden et al.
11,768,230 B1 9/2023 Liu et al.
11,885,866 B2 1/2024 Vuillermet et al.
11,892,476 B2 2/2024 Rock et al.
11,940,470 B2 3/2024 Messier et al.
12,306,217 B2 5/2025 Houis
12,487,255 B2 12/2025 Messier et al.
12,504,448 B2 12/2025 Kasparek
12,591,025 B2 3/2026 Shewmon et al.
2007/0279053 A1 12/2007 Taylor et al.
2008/0231255 A1 9/2008 Lepine et al.
2009/0121704 A1 5/2009 Shibara
2011/0270553 A1 11/2011 Ausserlechner et al.
2012/0001617 A1 1/2012 Reynolds
2012/0112365 A1 5/2012 Ausserlechner et al.
2012/0146164 A1 6/2012 Ausserlechner
2012/0253726 A1 10/2012 Xu
2012/0262152 A1 10/2012 Ausserlechner
2013/0015843 A1 1/2013 Doogue et al.
2013/0135548 A1 5/2013 Burberry et al.
2013/0335076 A1 12/2013 Sakamoto et al.
2014/0041923 A1 2/2014 Hisada et al.
2014/0111196 A1 4/2014 Sakai et al.
2014/0253103 A1 9/2014 Racz et al.
2014/0266181 A1 9/2014 Milano et al.
2014/0300349 A1 10/2014 Walker et al.
2014/0312883 A1 10/2014 Friedrich et al.
2015/0204915 A1 7/2015 Okuyama et al.
2015/0204916 A1 7/2015 Akimoto et al.
2015/0204919 A1 7/2015 Akimoto et al.
2015/0257261 A1 9/2015 Kitagawa
2015/0301149 A1 10/2015 Cesaretti et al.
2015/0323568 A1 11/2015 Schmitt
2015/0331079 A1 11/2015 Kolwalker et al.
2015/0338444 A1 11/2015 Ivanov et al.
2015/0362532 A1 12/2015 Chartouni
2016/0011239 A1 1/2016 Yoon et al.
2016/0223594 A1 8/2016 Suzuki et al.
2016/0274060 A1 9/2016 Deneneberg et al.
2016/0282388 A1 9/2016 Milano et al.
2017/0131329 A1 5/2017 Gorai et al.
2017/0160102 A1 6/2017 Heumann et al.
2017/0166251 A1 6/2017 Shao et al.
2017/0242058 A1 8/2017 Kawanami et al.
2017/0285075 A1 10/2017 Okuyama et al.
2018/0003742 A1 1/2018 Shimizu
2018/0031613 A1 2/2018 Nakayama
2018/0180649 A1 6/2018 Paci et al.
2018/0238938 A1 8/2018 Feucht et al.
2018/0274947 A1 9/2018 Maniouloux et al.
2018/0321283 A1 11/2018 Sei et al.
2019/0187187 A1 6/2019 Umetsu et al.
2019/0212372 A1 7/2019 Mendizabal et al.
2019/0242725 A1 8/2019 Shaga et al.
2019/0331541 A1 10/2019 Janisch et al.
2019/0391185 A1 12/2019 El Bacha et al.
2020/0011902 A1 1/2020 Shimizu
2020/0025804 A1 1/2020 Bussing et al.
2020/0057097 A1 2/2020 Vuillermet et al.
2020/0057120 A1 2/2020 Belin et al.
2020/0132725 A1 4/2020 Krummenacher et al.
2020/0300919 A1 9/2020 Song
2021/0080489 A1 3/2021 Koizumi
2021/0190545 A1 6/2021 Utermoehlen et al.
2021/0242353 A1 8/2021 Kim et al.
2021/0285794 A1 9/2021 Briano et al.
2021/0311136 A1 10/2021 Augendre et al.
2022/0018880 A1 1/2022 Houis
2022/0283200 A1 9/2022 Friedrich et al.
2023/0071087 A1 3/2023 Vuillermet et al.
2023/0163512 A1 * 5/2023 Strashny ................... B60L 9/00
2023/0251290 A1 8/2023 Vuillermet et al.
2023/0258693 A1 8/2023 Rock et al.
2023/0298779 A1 9/2023 Messier et al.
2023/0417802 A1 12/2023 Vuillermet et al.
2024/0003995 A1 1/2024 Rock et al.
2024/0004016 A1 1/2024 Vuillermet et al.
2024/0012034 A1 1/2024 Uhlig et al.
2025/0293577 A1 9/2025 Kasparek et al.
2025/0355025 A1 11/2025 Pavlov et al.

FOREIGN PATENT DOCUMENTS

CN 111711294 A * 9/2020 ............... H02K 1/22
CN 112649645 A 4/2021
EP 0289033 A2 11/1988
EP 4394331 33 7/2024
GB 2547732 14 8/2017
KR 20230001089 W 1/2023
WO WO 2006/079793 31 8/2006
WO WO 2017/144715 A1 8/2017
WO WO 2022/132229 50 6/2022
WO WO-2024182952 A1 * 9/2024 .......... H01M 50/593

OTHER PUBLICATIONS

U.S. Appl. No. 19/214,517 filed May 21, 2025, Foletto, et al.

Allegro MicroSystems Datasheet "Busbar Geometry And Design Techniques For Coreless ACS37610 Differential Current Sensor", Jan. 6, 2021, 11 pages.

Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.

Infineon Datasheet, "TLE4972-AE35D5 high precision coreless current sensor for automotive applications", Dec 21, 2021, 20 pages.

Melexis Inspired Engineering; "Current Sensors Reference Design Guide"; Aug. 2016; 27 Pages.

(56) References Cited

OTHER PUBLICATIONS

Extended European Search Report dated Jul. 10, 2018 for EP Application No. 18154879.3; 10 Pages.
Extended European Search Report dated Sep. 20, 2024 for European Application No. 22754690.0; 10 pages.
PCT Search Report and Written Opinion dated Oct. 31, 2022 for PCT Application No. PCT/US2022/038329; 12 pages.
Extended European Search Report dated Oct. 23, 2023 for European Application No. 23177829.1-1001; 13 Pages.
Extended European Search Report dated Mar. 17, 2025 for European Application No. 24185072.6; 15 pages.
PCT International Search Report and Written Opinion dated Jan. 9, 2023 for International Application No. PCT/IB2022/059686; 9 Pages.

* cited by examiner

| Parameter | Nominal Value (mm) | Tolerance (+/- mm) |
|---|---|---|
| $W_{C1}$ | 2.16 | 0.04 |
| $W_{C2}$ | 2.16 | 0.04 |
| $W_{C3}$ | 4.02 | 0.04 |
| N1 | 5.10 | 0.04 |
| N2 | 10.07 | 0.04 |
| L | 7.6 | 0.1 |
| W | 23.5 | 0.1 |
| T | 3 | 0.1 |

| Parameter | Nominal Value (mm) | Tolerance (+,- mm) |
|---|---|---|
| WC1 | 2.16 | 0.04 |
| WC2 | 2.16 | 0.04 |
| WC3 | 4.02 | 0.04 |
| N1 | 5.10 | 0.04 |
| N2 | 10.07 | 0.04 |
| L | 7.6 | 0.1 |
| W | 23.5 | 0.1 |
| T | 3 | 0.1 |

800

| | | Corresponding Curves | $W_{C1}$ (mm) | $W_{C2}$ (mm) | $W_{C3}$ (mm) | $W_{C1}/W_{C3}$ | T (mm) | L (mm) | Gain Error @ 2kHz (%) | Phase Error @ 2kHz (°) |
|---|---|---|---|---|---|---|---|---|---|---|
| 802 | DESIGN #1 | 602, 622 | 1.02 | 1.02 | 1.96 | 0.52 | 3 | 7.6 | 1.1 | -0.6 |
| 804 | DESIGN #2 | 604, 624 | 1.04 | 1.04 | 1.92 | 0.54 | 3 | 7.6 | -0.2 | -0.9 |
| 806 | DESIGN #3 | 606, 626 | 1.06 | 1.06 | 1.89 | 0.56 | 3 | 7.6 | -1.0 | -1.0 |
| 808 | DESIGN #4 | 608, 628 | 1.07 | 1.07 | 1.85 | 0.58 | 3 | 7.6 | -1.8 | -1.2 |
| 810 | DESIGN #5 | 610, 630 | 1.09 | 1.09 | 1.82 | 0.60 | 3 | 7.6 | -2.3 | -1.3 |

FIG. 8

1100

| | | Corresponding Curves | $W_{C1}$ (mm) | $W_{C2}$ (mm) | $W_{C3}$ (mm) | $W_{C1}/W_{C3}$ | T (mm) | L (mm) | Gain Error @ 2kHz (%) | Phase Error @ 2kHz (°) |
|---|---|---|---|---|---|---|---|---|---|---|
| 1102 | DESIGN #6 | 1002, 1022 | 2.12 | 2.12 | 4.08 | 0.52 | 3 | 7.6 | -0.2 | -1.7 |
| 1104 | DESIGN #7 | 1004, 1024 | 2.16 | 2.16 | 4.01 | 0.540 | 3 | 7.6 | -0.7 | -1.8 |
| 1106 | DESIGN #8 | 1006, 1026 | 2.20 | 2.20 | 3.93 | 0.56 | 3 | 7.6 | -1.4 | -2.0 |
| 1108 | DESIGN #9 | 1008, 1028 | 2.24 | 2.24 | 3.86 | 0.580 | 3 | 7.6 | -2.2 | -2.1 |
| 1110 | DESIGN #10 | 1010, 1030 | 2.27 | 2.27 | 3.79 | 0.60 | 3 | 7.6 | -2.5 | -2.2 |

FIG. 11

BANDWIDTH BY TUNING RELATIVE CONDUCTOR SIZE IN A VERTICAL SLIT CONDUCTOR

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a system is provided comprising: a conductor having a first through-hole and a second through-hole formed therein, the first and second through-holes being arranged to define a first leg, a second leg, and a third leg of the conductor, the first leg having a first width, the second leg having a second width that is substantially equal to the first width, and the third leg having a third width, the second leg being disposed between the first through-hole and the second through-hole, the first leg being disposed across the first through-hole from the second leg, and the third leg being disposed across the second through-hole from the second leg; and a current sensor that is disposed in the first through-hole, the current sensor being arranged to measure a level of electrical current through the conductor, wherein a ratio between the first width and the third width is in the range of 0.45-0.60.

According to aspects of the disclosure, a system is provided comprising: a conductor having a first through-hole and a second through-hole formed therein, the first and second through-holes being arranged to define a first leg, a second leg, and a third leg of the conductor, the first leg having a first width, the second leg having a second width, and the third leg having a third width, the second leg being disposed between the first through-hole and the second through-hole, the first leg being disposed across the first through-hole from the second leg, and the third leg being disposed across the second through-hole from the second leg; and a current sensor that is disposed in the first through-hole, the current sensor being arranged to measure a level of electrical current through the conductor, wherein a ratio between an average of the first and second widths and the third width is in the range of 0.35-0.70.

According to aspects of the disclosure, an electrical conductor is provided for use in power supply applications, the electrical conductor comprising: a first through-hole formed therein; a second through-hole formed therein; a first leg having a first width; a second leg having a second width that is substantially equal to the first width; and a third leg having a third width, wherein the second leg is disposed between the first through-hole and the second through-hole, the first leg is disposed across the first through-hole from the second leg, and the third leg is disposed across the second through-hole from the second leg, and wherein a ratio between the first width and the third width is in the range of 0.45-0.60.

According to aspects of the disclosure, an electrical conductor is provided for use in power supply applications, the electrical conductor comprising: a first through-hole formed therein; a second through-hole formed therein; a first leg having a first width; a second leg having a second width; and a third leg having a third width, wherein the second leg is disposed between the first through-hole and the second through-hole, the first leg is disposed across the first through-hole from the second leg, and the third leg is disposed across the second through-hole from the second leg, and wherein a ratio between an average of the first and second widths and the third width is in the range of 0.35-0.70.

BRIEF DESCRIPTION OF THE DRAWINGS

The foregoing features may be more fully understood from the following description of the drawings in which:

FIG. 8 is a table listing various characteristics of the first set of system designs, according to aspects of the disclosure;

FIG. 11 is a table listing various characteristics of the second set of system designs, according to aspects of the disclosure;

DETAILED DESCRIPTION

Figure 1:
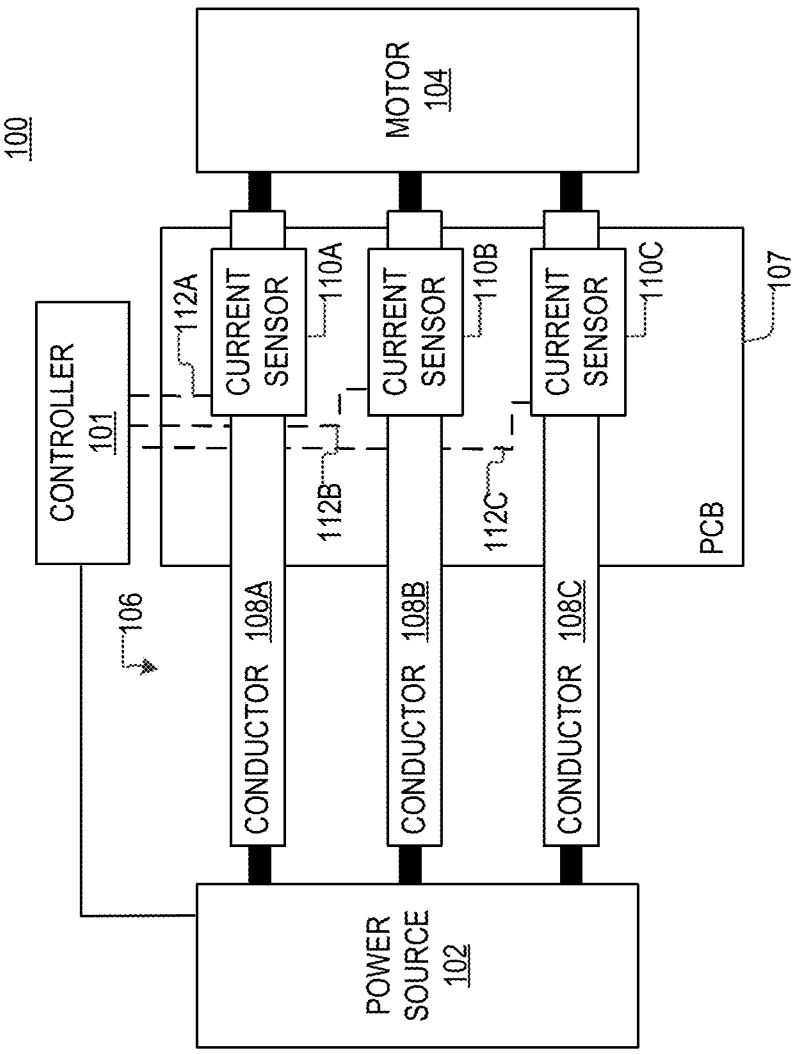
FIG. 1 is a diagram of an example of a system, according to aspects of the disclosure.

FIG. 1A is a diagram of an example of a system 100, according to aspects of the disclosure. System 100 may be part of an electrical vehicle and/or any other suitable type of machinery. As illustrated, system 100 may include a controller 101, a power source 102 that is coupled to an electric motor 104 via conductors 108A-C, and a printed circuit board (PCB) 107.

The PCB 107 may include current sensors 110A-C that are mounted on it. The current sensors 110A-C may be coupled to the controller 101 via conductive traces 112A-C. Each of the conductive traces 112A-C may include one or more metal layers (or layers of another conductive material) that are at least partially encapsulated in a dielectric material of the PCB 107. Each of the conductors may be a busbar (or another type of conductor) that is configured to deliver electrical current from the power source 102 and the motor 104. Each of the conductors 108A-C may be formed by stamping sheet metal and/or in any other suitable manner. According to the present example, the conductors 108A-C are separate from the PCB 107 and are disposed above the PCB 107. However, alternative implementations are possible in which one or more of conductors 108A-C are integrated into the PCB 107.

Current sensors 110A-C may be configured to measure the level of electrical current through conductors 108A-C. Specifically, current sensor 110A may be configured to measure the level of electrical current through conductor 108A; current sensor 110B may be configured to measure the electrical current through conductor 108B; and current sensor 110C may be configured to measure the level of electrical current through conductor 108C. Although, in the example of FIG. 1, PCB 107 is provided with three current sensors, in some implementations, one or more of current sensors 110B and 110C may be omitted. Furthermore, in some implementations, PCB 107 may be provided with more than three conductors 108 and more than three current sensors 110. It will be understood that the present disclosure is not limited to any specific implementation of current sensors 110A-C. In other words, any suitable type of current sensor may be used to measure the electrical current through conductors 108A-C.

Figure 2:
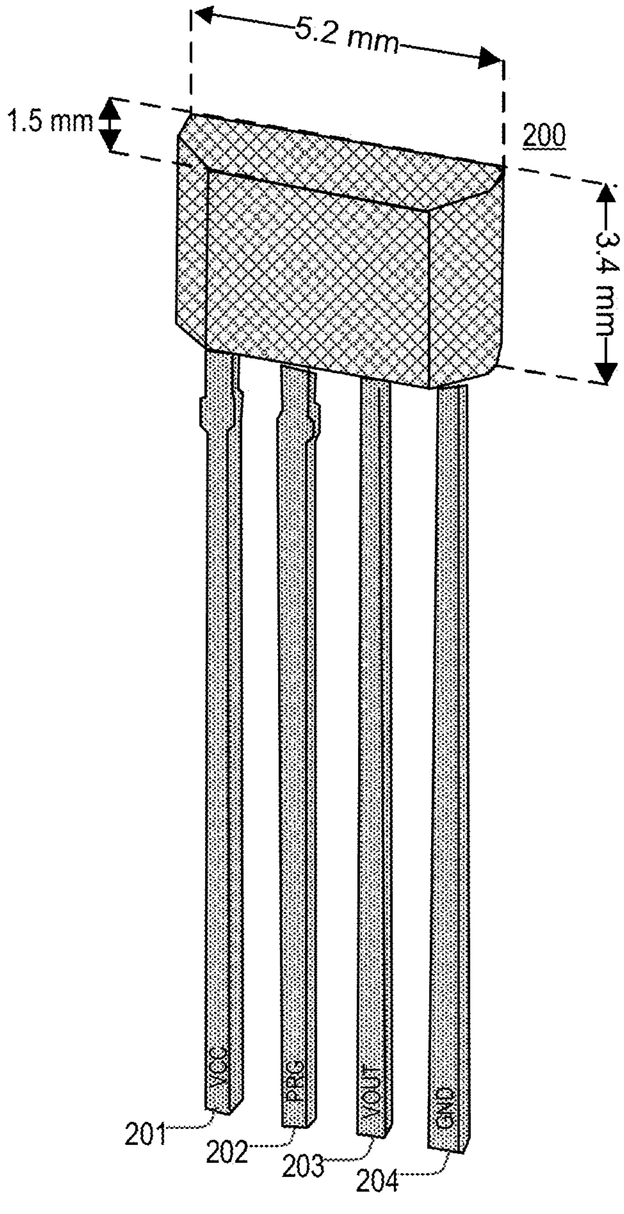
FIG. 2 is a diagram of an example of a current sensor, according to aspects of the disclosure.

FIG. 2 is a diagram of an example of the packaging of a current sensor 200, according to aspects of the disclosure. Current sensor 200 may be a coreless, high precision, current sensor integrated circuit (IC) in a System-in-Package (SIP) package with Common-Mode Field Rejection. Current sensor 200 may be the same or similar to any of the current sensors 110A, 110B, and 110C. As illustrated, current sensor 200 may include pins 201-204. Pin 201 may be a power supply pin, pin 202 may be a bidirectional programming pin, pin 203 may be an analog output pin, and pin 204 may be a ground pin. In some implementations, the packaging of sensor 200 may be 5.2 mm long, and 3.4 mm thick, and 1.5 mm wide. In some respects, FIG. 2 is provided to illustrate the dimensions and shape of the packaging of the current sensors 110A-C, in accordance with one example.

Figure 3:
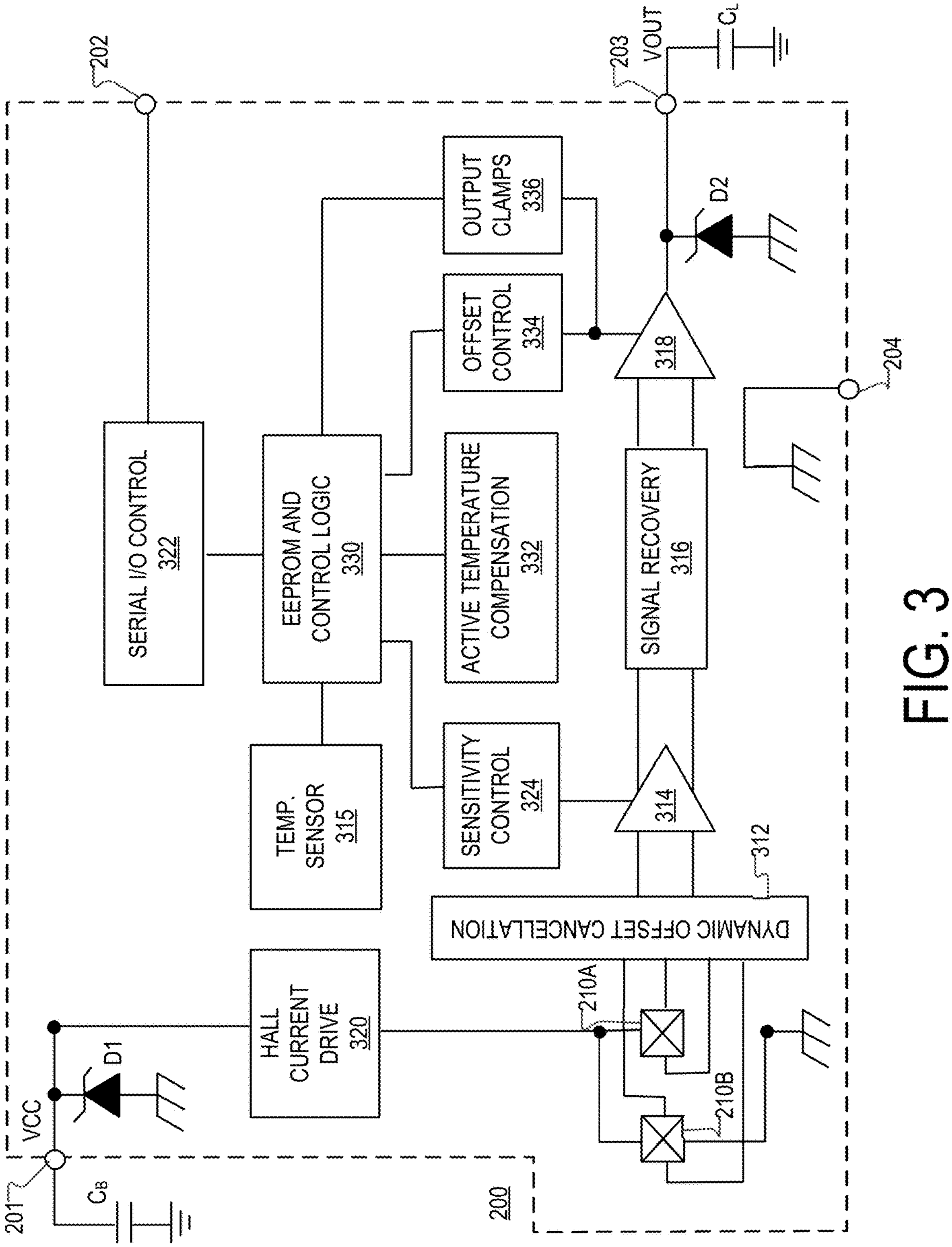
FIG. 3 is a diagram of an example of a current sensor, according to aspects of the disclosure.

FIG. 3 is a circuit diagram illustrating one possible implementation of the electronic circuitry of sensor 200.

The sensor 200 may be configured to output a signal VOUT that is proportional to $\Delta B = B_R - B_L$ where $B_R$ represents magnetic field incident on one of the magnetic field sensing elements 210A-B and $B_L$ represents magnetic field incident on the other one of the magnetic field sensing elements 210A-B. The sensor output VOUT is also affected by the sensitivity, α, of the signal path and can be represented as follows:

$$VOUT = \alpha \times \Delta B \tag{1}$$

The relationship between the conductor current to be measured and the differential field ΔB can be represented by a coupling coefficient, K(f) as follows:

$$\Delta B = K(f) \times I \tag{2}$$

It will be appreciated that coupling coefficient K(f) corresponds to coupling (e.g., transfer of energy, etc.) between a given current sensor and varies with frequency. As is discussed further below, the design of the conductors 108A-C helps reduce the variation of the coupling coefficient K(f) with respect to the frequency of the current that is being transmitted over conductors 108A-C.

As noted above, the sensor 200 may include the power supply pin 201, the programming pin 202, the output pin 203, and the ground pin 204. The power supply pin 201 is used for the input power supply or supply voltage for the current sensor 200. A bypass capacitor, $C_B$, can be coupled between the power supply pin 201 and ground. The programming pin 202 can be used for programming the current sensor 200. The output pin 203 is used for providing the output signal VOUT to external circuits and systems (not shown) such as controller 101 (FIG. 1) and can also be used for programming. An output load capacitance $C_L$ is coupled between the output pin 203 and ground. The example current sensor 110 can include a first diode D1 coupled between the power supply pin 201 and chassis ground and a second diode D2 coupled between the output pin 203 and a ground pad of sensor 200 (not shown). The diodes D1 and D2 may be provided for ESD protection-so that static electricity discharging is shunted through the diode instead of destroying the internal circuitry of the sensor.

The driver circuit 320 may be configured to drive the magnetic field sensing elements 210A and 210B. Magnetic field signals generated by the magnetic field sensing elements 210A and 210B are coupled to a dynamic offset cancellation circuit 312, which is further coupled to an amplifier 314. The amplifier 314 is configured to generate an amplified signal for coupling to the signal recovery circuit 316. Dynamic offset cancellation circuit 312 may take various forms including chopping circuitry and may function in conjunction with offset control circuit 334 to remove offset that can be associated with the magnetic field sensing elements 210A-B and/or the amplifier 314. For example, offset cancellation circuit 312 can include switches configurable to drive the magnetic field sensing elements 210A-B (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 200 to regulate the supply voltage.

A serial I/O control circuit 322 is coupled between the programming pin 202 and EEPROM and control logic circuit 330 to provide appropriate control to the EEPROM and control logic circuit 330. EEPROM and control logic circuit 330 determines any application-specific coding and can be erased and reprogrammed using a pulsed voltage. A sensitivity control circuit 324 can be coupled to the amplifier 314 to generate and provide a sensitivity control signal to the amplifier 314 to adjust the sensitivity and/or operating voltage of the amplifier 314. An active temperature compensation circuit 332 can be coupled to sensitivity control circuit 324, EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via a temperature sensor 315 and perform necessary calculations to compensate for changes in temperature, if needed. Output clamps circuit 336 can be coupled between the EEPROM and control logic circuit 330 and the driver circuit 318 to limit the output voltage and for diagnostic purposes.

Figure 4A:
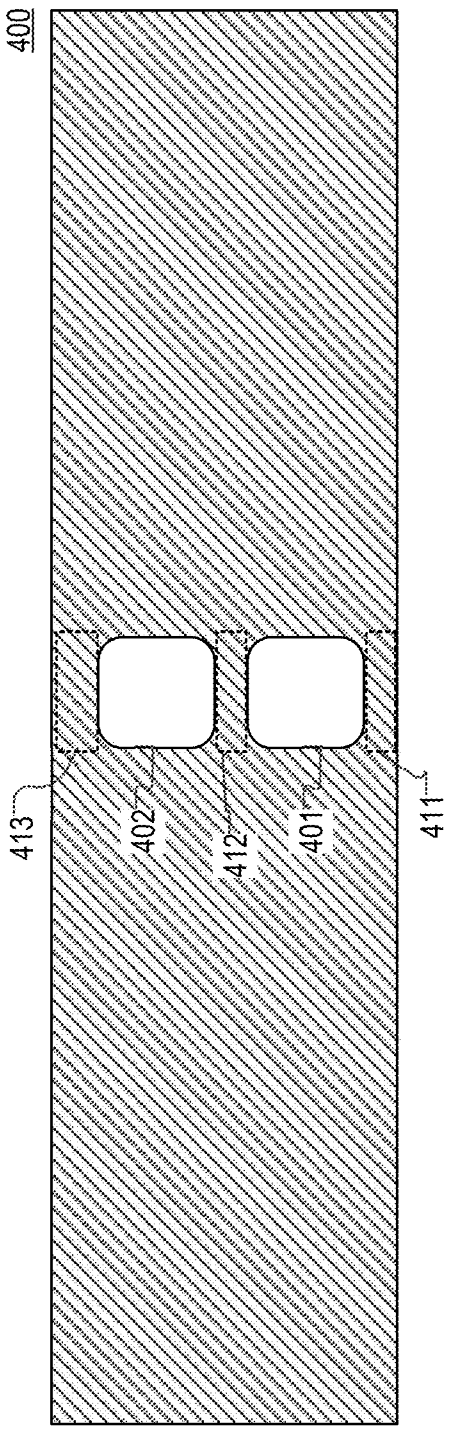
FIG. 4A (prior art)
FIG. 4A is a diagram of an example of a conductor, according to the prior art.
Figure 4B:
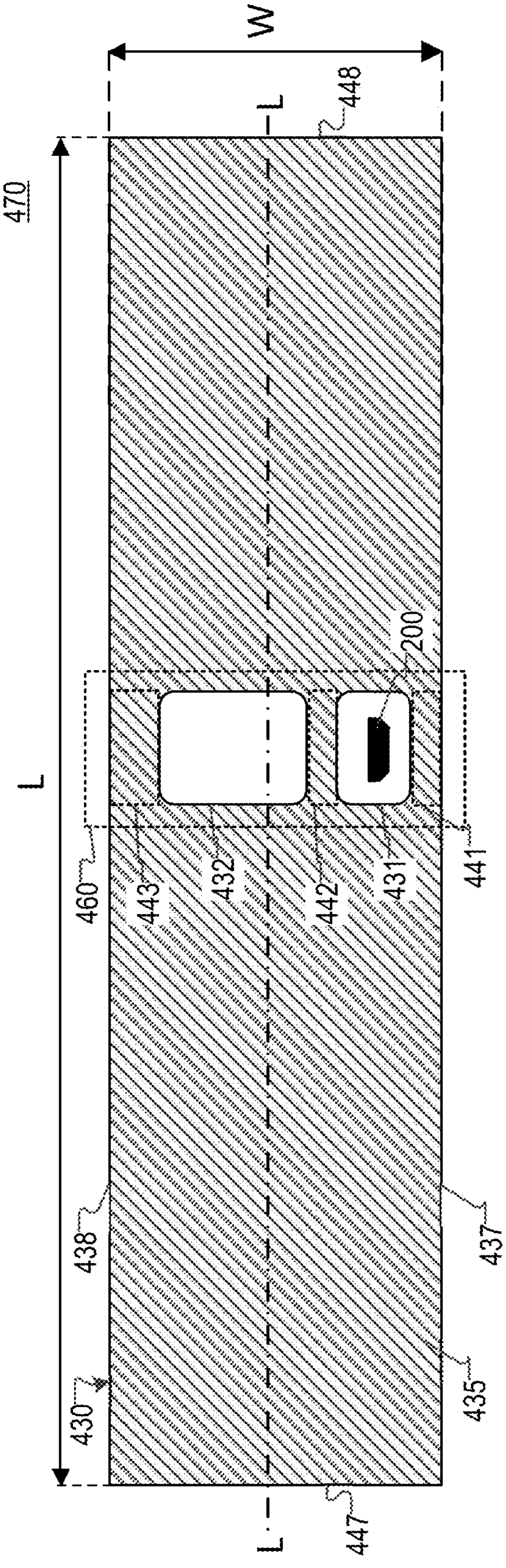
FIG. 4B is a planar top-down view of an example of a system, according to aspects of the disclosure.
Figure 4C:
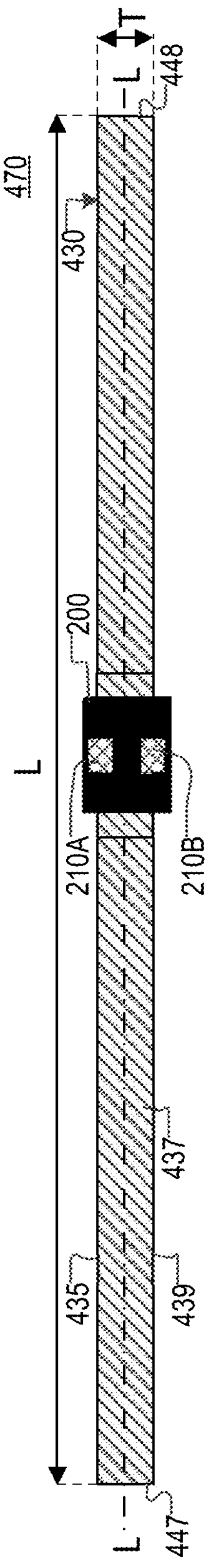
FIG. 4C is a planar side view of the system of FIG. 4B, according to aspects of the disclosure.

FIG. 4A is a diagram of a conductor design, according to the prior art. Shown in FIG. 4A is a conductor 400, which may be the same or similar to each of conductors 108A-C that are shown in FIG. 1. As illustrated, conductor 400 may include through-holes 401 and 402 that are formed therein. A leg 412 may be formed between through-holes 401 and 402. A leg 411 may be formed across through-hole 401 from leg 412. And a leg 443 may be formed across through-hole 413 from leg 412.

When designing a conductor for coreless current sensing, the conductor's shape strongly affects the frequency response of the sensor. As frequency increases, the skin effect pushes current density away from the center of the conductor and toward the edges. For this reason, the change in magnetic field over frequency will be larger for conductors that have a larger cross-sectional area, as the shift in the distribution of the current density will be larger (longer distance to move from the center of the conductor to the edge).

According to the present example, it has been determined conductor 400 has poor frequency performance, meaning that when used in conjunction with a current sensor, conductor 400 causes the current sensor to have a poor frequency response. For this reason, several optimizations have been introduced into the basic design of FIG. 4A, which results in improved frequency response. Examples of these optimizations are discussed further below with respect to FIGS. 4B-12.

FIGS. 4B-G show an example of a system 470, according to aspects of the disclosure. As illustrated, system 470 may include a conductor 430 and the current sensor 200. The conductor 430 may be the same or similar to each of conductors 108A-C, which are discussed above with respect to FIG. 1. Conductor 430 may include main surfaces 435 and 439, which extend between sidewalls (or edges) 437, 438, 447, and 448 of the conductor 430. According to the present example, main surface 435 has a rectangular shape. Main surface 439 may have an identical shape and dimensions to that of main surface 435. Main surfaces 435 and 439 may be parallel to each other. Sidewall 437 may have a rectangular shape. Sidewall 438 may have the same shape and dimensions as sidewall 437. Sidewall 437 may be parallel to sidewall 438. The conductor 430 may have a length L, a width W, and a thickness T. Furthermore, the conductor 430 may have a central longitudinal axis L-L. Axis L-L may be parallel and equidistant from the main surfaces 435 and 439. The axis L-L may also be parallel and equidistant from sidewalls (or edges) 437 and 438.

A first through-hole 431 and a second through-hole 432 may be formed in a region 460 of the conductor 430, as shown. The through-holes 431 and 432 may define a first leg 441, a second leg 442, and a third leg 443. According to the present example, leg 443 has a greater width than legs 442 and 441. As is discussed further below, making leg 443 wider than legs 441 and 442 is advantageous because it results in the conductor 430 having a better frequency performance than conventional designs, such as the design that is shown in FIG. 4A.

The sensor 200 may be inserted in through-hole 431, such that magnetic field sensing element 210A is disposed above the axis L-L and magnetic field sensing element 210B is disposed below the axis L-L. The respective axis of maximum sensitivity of sensing elements 210A-B may be substantially perpendicular to the axis L-L. According to the present example, each of sensing elements 210A-B is at least partially situated in through-hole 431. However, alternative implementations are possible in which one of sensing elements 210A-B is situated below conductor 430 and the other one of sensing elements 210A-B is situated above the conductor. Furthermore, additional implementations are possible in which both of sensing elements 210A-B are situated above (or below) the conductor 430.

Figures 4D, 4E:
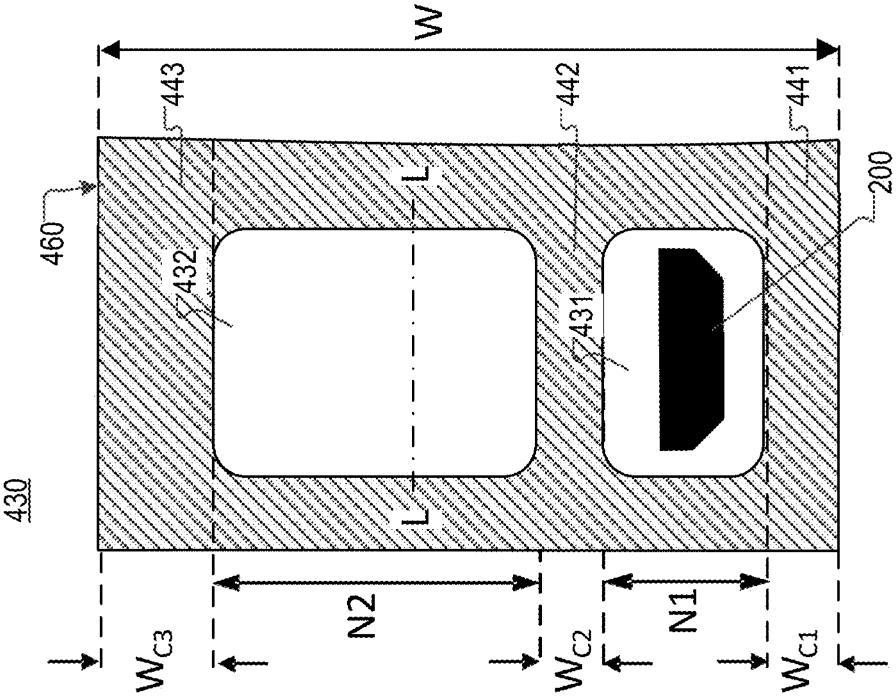
FIG. 4D is a planar top-down view of a portion of the system of FIG. 4B, according to aspects of the disclosure, according to aspects of the disclosure.
FIG. 4E is a table showing example dimensions for a conductor that is part of the system of FIG. 4B, according to aspects of the disclosure.

FIG. 4D shows region 460 of conductor 430 in greater detail. As illustrated, the through-hole 431 may have a width N1, through-hole 432 may have a width N2, leg 441 may have a width $W_{C1}$, leg 442 may have a width $W_{C2}$, and leg 443 may have a width $W_{C3}$. According to the present example, the width $W_{C1}$ is equal to the width $W_{C2}$. However, alternative implementations are possible in which the widths $W_{C1}$ and $W_{C2}$ are different from each other. According to the present example, the width $W_{C3}$ is greater than both of the widths $W_{C1}$ and $W_{C2}$. However, alternative implementations are possible in which the width $W_{C3}$ is different than at least one of the widths $W_{C1}$ and $W_{C2}$. According to the present example, the width N2 of through-hole 432 is greater than the width N1 of through-hole 431. However, alternative implementations are possible in which the width N1 is greater than or equal to the width N1.

FIG. 4E shows an example of one possible set of dimensions for conductor 430, according to aspects of the disclosure. According to the example of FIG. 4E, the width $W_{C1}$ of leg 441 may be equal to 2.16 mm; the width $W_{C2}$ of leg 442 may be equal to 2.16 mm; the width $W_{C3}$ of leg 443 may be equal to 4.02 mm; the width N1 of the through-hole 431 may be equal to 5.10 mm; the width N2 may of the through-hole 432 may be equal to 10.07 mm; the length L of conductor 430 may be equal to 7.6 mm; the width W of conductor 430 may be equal to 23.5 mm; and the thickness T of conductor 430 may be equal to 3 mm. In a preferred implementation, the widths $W_{C1}$, $W_{C2}$, $W_{C3}$, N1, and N2 may have a tolerance of +/−0.04 mm each, and the length L, the width W, and thickness T may each have a tolerance of +/−0.1 mm.

Figure 4F:
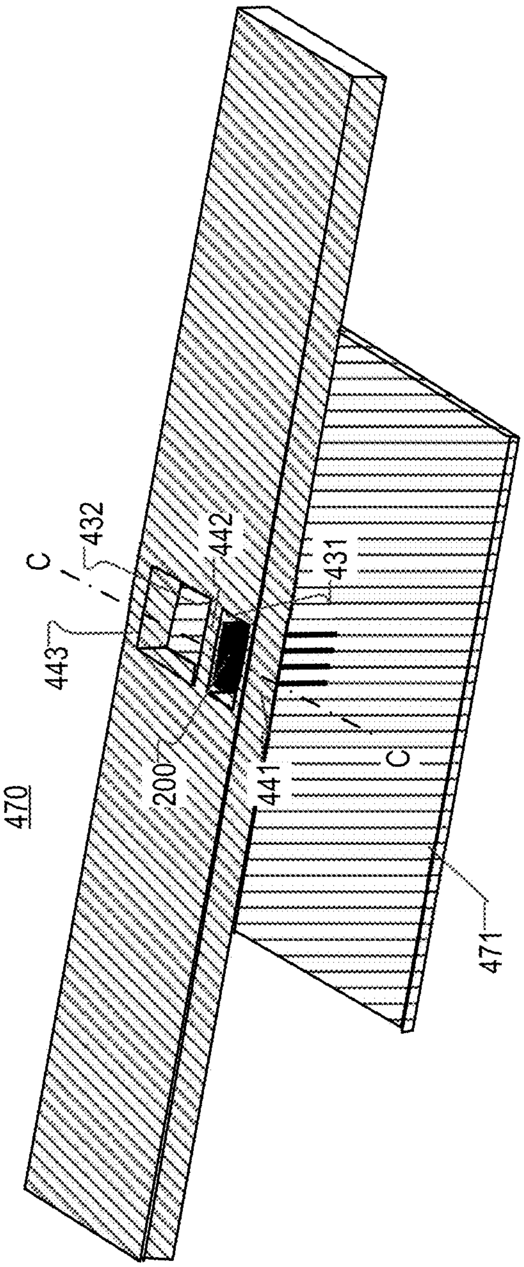
FIG. 4F is a perspective view of the system of FIG. 4B, according to aspects of the disclosure.

FIG. 4F is a perspective schematic view of system 470, according to aspects of the disclosure. FIG. 4F illustrates that the sensor 200 may be mounted on a PCB 471 that is disposed above or below the conductor 430. The PCB 471 may be the same or similar to the PCB 107, which is discussed above with respect to FIG. 1. Although not shown, PCB 471 may have a controller mounted thereon, one or more other current sensors, and/or any other suitable type of processing circuitry.

Figure 4G:
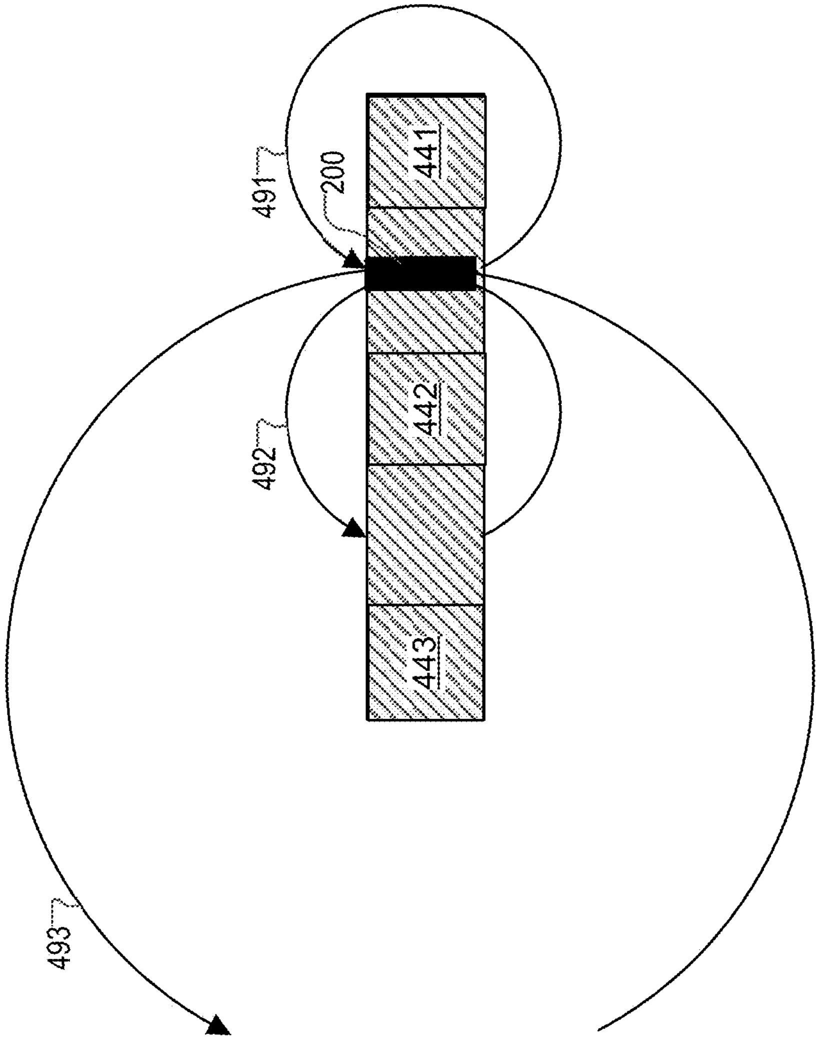
FIG. 4G is a diagram illustrating aspects of the operation of the system of FIG. 4B, according to aspects of the disclosure.
Figures 5A, 5B:
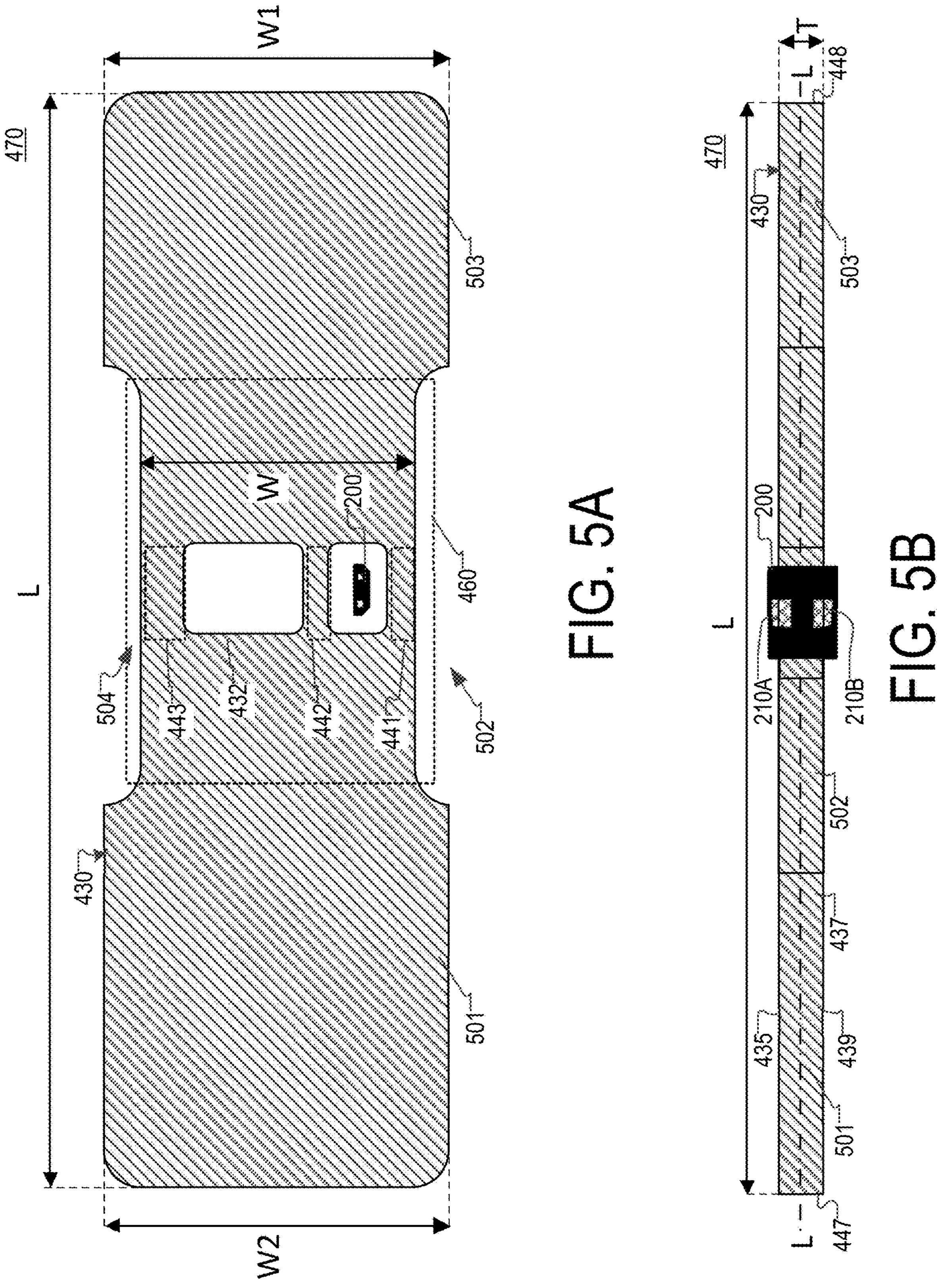
FIG. 5A is a planar top-down view of an example of a system, according to aspects of the disclosure.
FIG. 5B is a planar side view of the system of FIG. 5A, according to aspects of the disclosure.
Figures 5C, 5D:
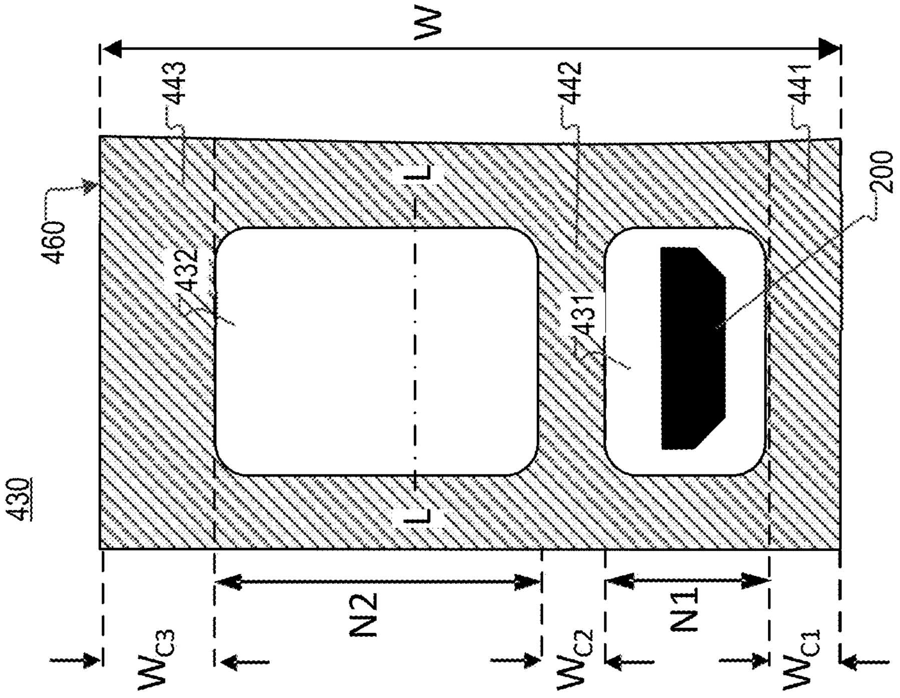
FIG. 5C is a planar top-down view of a portion of the system of FIG. 5A, according to aspects of the disclosure, according to aspects of the disclosure.
FIG. 5D is a table showing example dimensions for a conductor that is part of the system of FIG. 5A, according to aspects of the disclosure.

FIG. 4G is a cross-sectional planar view of the conductor 430, which is taken along an axis C-C (shown in FIG. 4F). FIG. 4G is provided to illustrate the principle of operation of conductor 430. Shown in FIG. 4G are magnetic field lines 491, 492, and 493. Line 491 corresponds to the magnetic field originating from leg 441. Line 492 corresponds to the magnetic field originating from leg 442. And line 493 corresponds to the magnetic field originating from leg 443.

Lines 491-493 illustrate that legs 441 and 442 contribute strongly (and equally) to the differential magnetic field sensed by the sensor 200, while leg 443 contributes very little (in comparison). The relative width of each one of legs 441, 442, and 443 determines the relative shift in the useful (to be sensed) magnetic field that it produces as frequency increases. At low frequency, conductor 430 is a current divider that is proportional to the relative cross-sectional areas of legs 441, 442, and 443. At higher frequency, the system is a current divider that is approximately proportional to relative cross-sectional surface areas of legs 441, 442, and 443. At high frequency, the system is a current divider that is approximately proportional to relative cross-sectional surface areas of legs 441, 442, and 443. At higher frequency, eddy currents affect the distribution of current density within each conductor, causing an increase in the relative current carried by conductors with smaller cross section. By varying the relative widths (and with this the relative surface areas) of legs 441, 442, and 443, one can vary the shift in the current density as frequency increases, and find an optimum where the shift is as small as possible, such that the sensitivity of the current sensor 200 minimally changes over frequency.

In one respect, the relative widths of legs 441, 442, and 443 may be described by first characteristic ratio R, which is defined by equation 3 below:

$$R = \frac{W_{C1}}{W_{C3}} \tag{3}$$

According to the present disclosure, it has been determined that values of R in the range of 0.45-0.6 yield gain error in the range of −2%-1.5%, for frequencies up to 1 KHz.

FIGS. 5A-D show an example of another implementation of the system 470, according to aspects of the disclosure. In the example of FIGS. 5A-D, notches 502 and 504 are formed on each side of region 460. The width of region 460 is still W, while end portions 501 and 503 of conductor 430 have widths W1 and W2, respectively. According to the present example the width W1 is the same as the width W2, however alternative implementations are possible in which they are different. Widths W1 and W2 are both greater than the width W. Although, in the present example, conductor 430 includes a notch on each side of the region 460, alternative implementations are possible in which a notch is provided in which a notch is provided only one side of the region 460. Apart from the conductor 430 being provided with one or more notches, the implementation of system 470 that is shown in FIGS. 5A-D is identical to the implementation shown in FIGS. 4B-G.

As noted above, the frequency response of conductor 430 may be tuned by varying the first characteristic ratio R between the width $W_{C1}$ of leg 441 and the width $W_{C3}$ of leg 443, as defined by equation 3 above. In this regard, several designs for conductor 430 are provided, which are herein enumerated as Designs 1-5. For each of Designs 1-5, the sum of the cross-sectional areas of the 3 legs 441-443 is 12 $mm^2$. The respective dimensions for each of Designs 1-5 are provided in table 800, which is shown in FIG. 8. Specifically, row 802 of table 800 shows the dimensions of Design 1; row 804 of table 800 shows the dimensions of Design 2; row 806 of table 800 shows the dimensions of Design 3; row 808 of table 800 shows the dimensions of Design 4; and row 810 of table 800 shows the dimensions of Design 5. As illustrated, the value of the first characteristic ratio R for Design 1 may be 0.53; the value of the first characteristic ratio R for Design 2 may be 0.54; the value of the first characteristic ratio R for Design 3 may be 0.56; the value of the first characteristic ratio R for Design 4 may be 0.58; and the value of the first characteristic ratio R for Design 2 may be 0.60.

Figure 6:
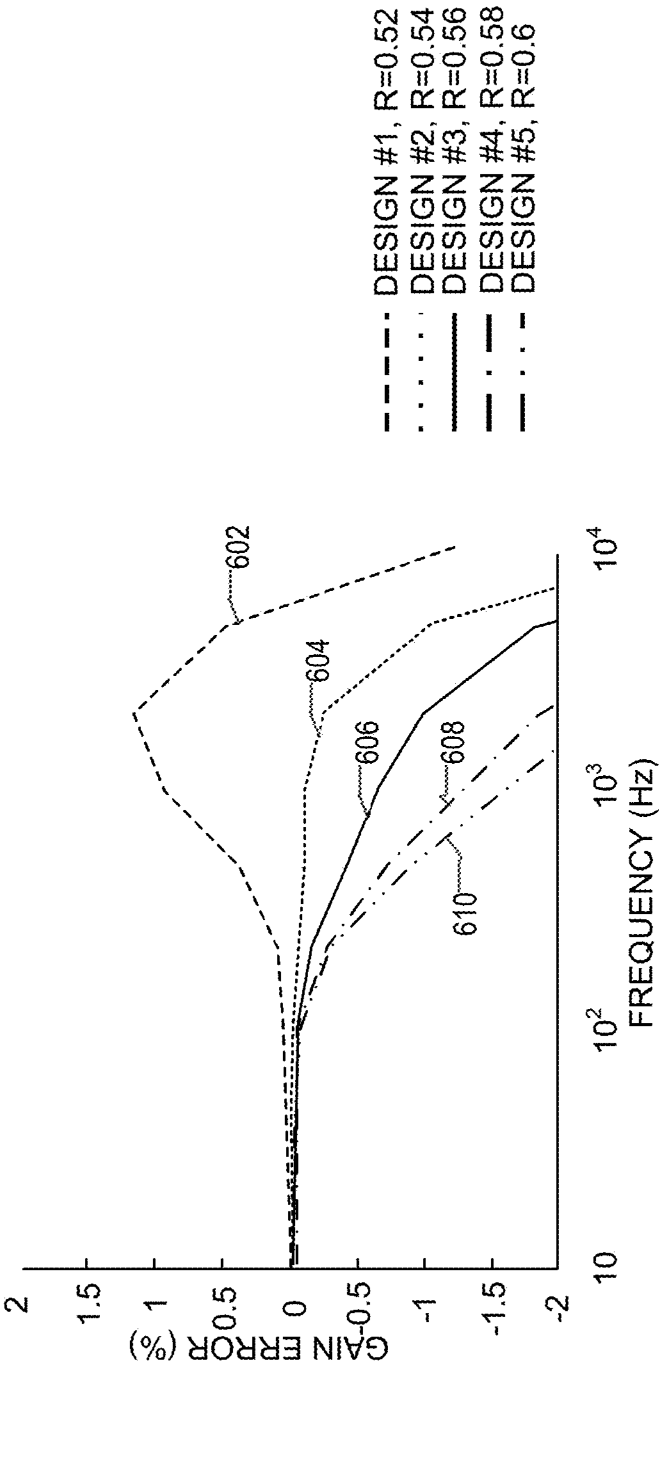
FIG. 6 is a graph illustrating aspects of the performance of a first set of system designs, according to aspects of the disclosure.

FIG. 6 shows curves 602-610, which illustrate the respective gain error for each of Designs 1-5. Curve 602 represents the gain error for Design 1, and it shows that Design 1 may have a gain error of 1.1% at 2 kHz. Curve 604 represents the gain error for Design 2, and it shows that Design 2 may have a gain error of −0.2% at 2 kHz. Curve 606 represents the gain error for Design 3, and it shows that Design 3 may have a gain error of −1.0% at 2 kHz. Curve 608 represents the gain error for Design 4, and it shows that Design 4 may have a gain error of −1.8% at 2 kHz. Curve 610 represents the gain error for Design 5, and it shows that Design 5 may have a gain error of −2.3% at 2 kHz. Curves 602-610 were generated by simulating Designs 1-5 with the Ansys Maxwell™ electromechanical device analysis software.

Figure 7:
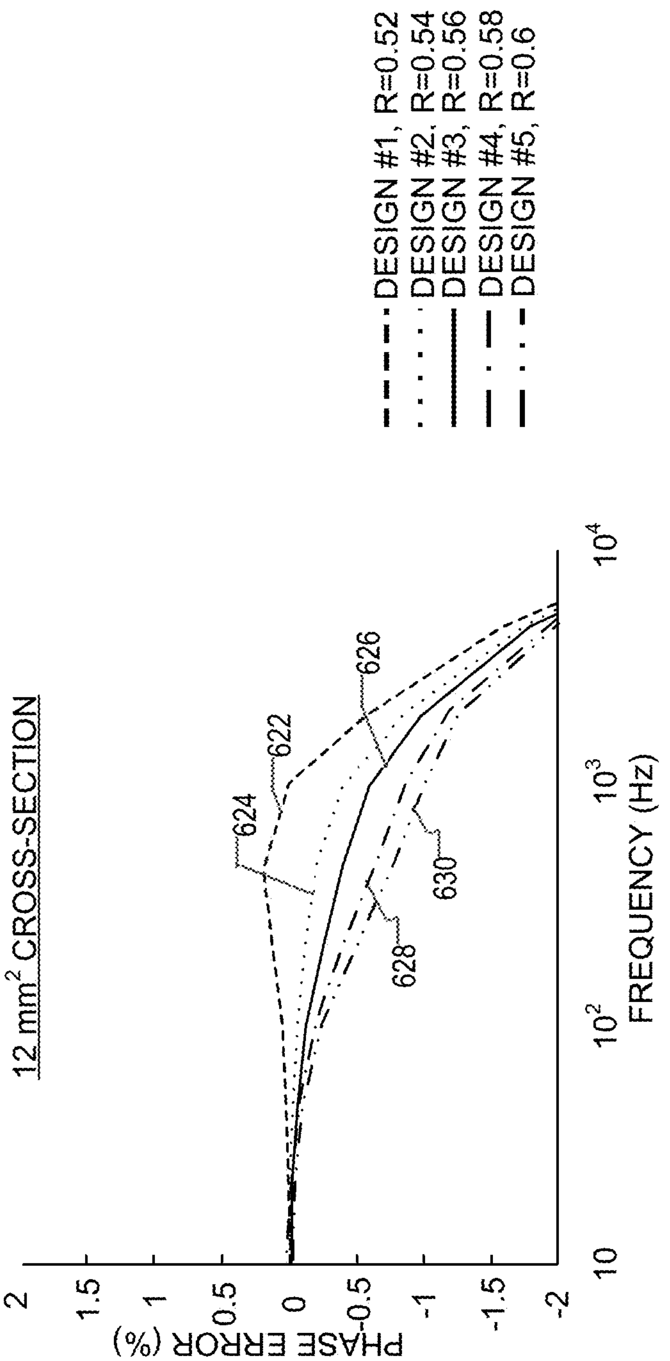
FIG. 7 is a graph illustrating aspects of the performance of the first set of system designs, according to aspects of the disclosure.

FIG. 7 shows curves 622-630, which illustrate the respective phase error for each of Designs 1-5. Curve 622 represents the phase error for Design 1, and it shows that Design 1 may have a phase error of −0.6° at 2 kHz. Curve 624 represents the phase error for Design 2, and it shows that Design 2 may have a phase error of −0.9° at 2 kHz. Curve 626 represents the phase error for Design 3, and it shows that Design 3 may have a phase error of −1.0° at 2 kHz. Curve 628 represents the phase error for Design 4, and it shows that Design 4 may have a phase error of −1.2° at 2 kHz. Curve 630 represents the phase error for Design 5, and it shows that Design 5 may have a phase error of −1.3° at 2 kHz. Curves 622-630 were generated by simulating Designs 1-5 with the Ansys Maxwell™ electromagnetic simulation software.

FIGS. 6-8 show that a large change in the frequency response of conductor 430 may result from a small change in its dimensions and/or manufacturing tolerances. For instance, in the example of FIGS. 6-8, a shift from +1% to −1% gain error can result from a 40 μm change in the widths $W_{C1}$ and $W_{C2}$ and a 70 μm change in the width $W_{C3}$.

Additional several designs for conductor 430 are now described, which are enumerated as Designs 6-10. For each of designs 6-10, the sum of the cross-sectional area of legs 431-433 is 25 $mm^2$. The respective dimensions for each of Designs 6-10 are provided in table 1100, which is shown in FIG. 11. Specifically, row 1102 of table 1100 shows the dimensions of Design 6; row 1104 of table 1100 shows the dimensions of Design 7; row 1106 of table 1100 shows the dimensions of Design 8; row 1108 of table 1100 shows the dimensions of Design 9; and row 1110 of table 1100 shows the dimensions of Design 10. As illustrated, the value of the first characteristic ratio R for Design 6 may be 0.52; the value of the first characteristic ratio R for Design 7 may be 0.54; the value of the first characteristic ratio R for Design 8 may be 0.56; the value of the first characteristic ratio R for Design 9 may be 0.58; and the value of the first characteristic ratio R for Design 10 may be 0.60.

Figure 9:
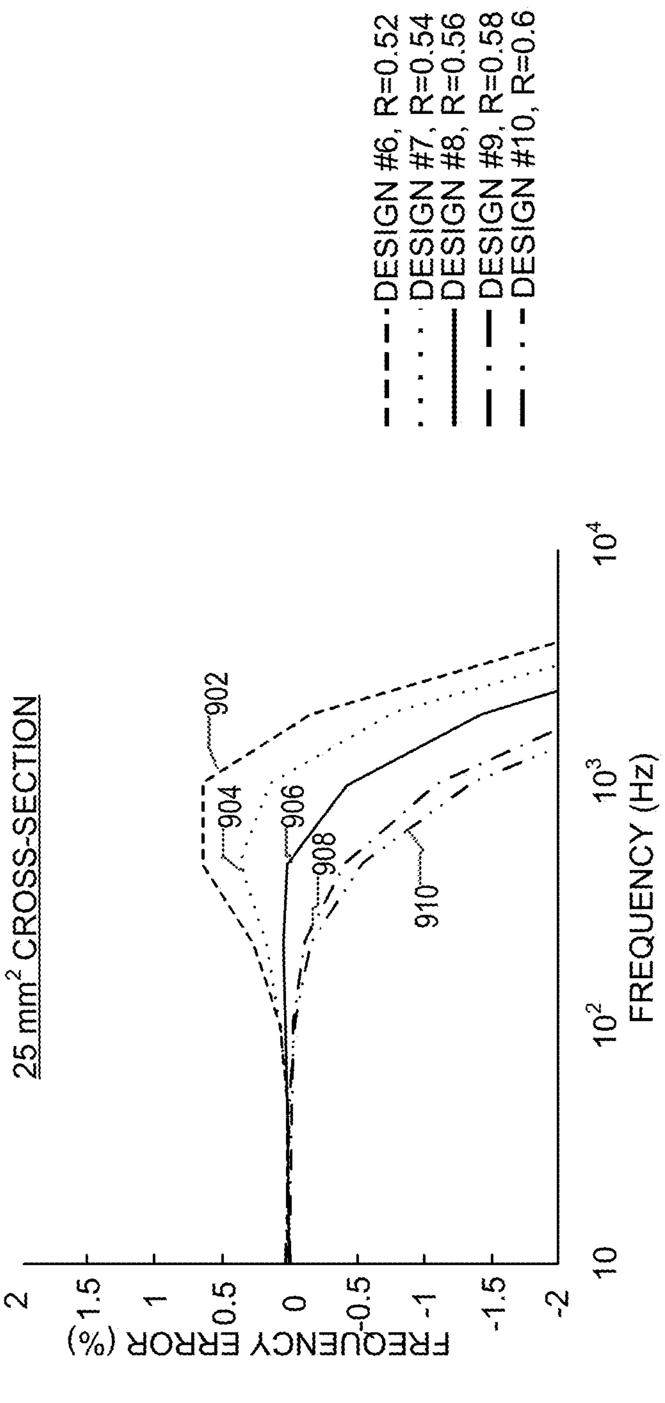
FIG. 9 is a graph illustrating aspects of the performance of a second set of system designs, according to aspects of the disclosure.

FIG. 9 shows curves 902-910, which illustrate the respective gain error for each of Designs 6-10. Curve 902 represents the gain error for Design 6, and it shows that Design 6 may have a gain error of −0.2% at 2 kHz. Curve 904 represents the gain error for Design 7, and it shows that Design 7 may have a gain error of −0.7% at 2 kHz. Curve 906 represents the gain error for Design 8, and it shows that Design 8 may have a gain error of −1.4% at 2 kHz. Curve 908 represents the gain error for Design 9, and it shows that Design 9 may have a gain error of −2.2% at 2 kHz. Curve 910 represents the gain error for Design 10, and it shows that Design 10 may have a gain error of −2.5% at 2 kHz. Curves 902-910 were generated by simulating Designs 6-10 with the Ansys Maxwell™ electromagnetic simulation software. The simulations modeled the magnetic fields generated when 600 A of electrical current flows through the conductor 430.

Figure 10:
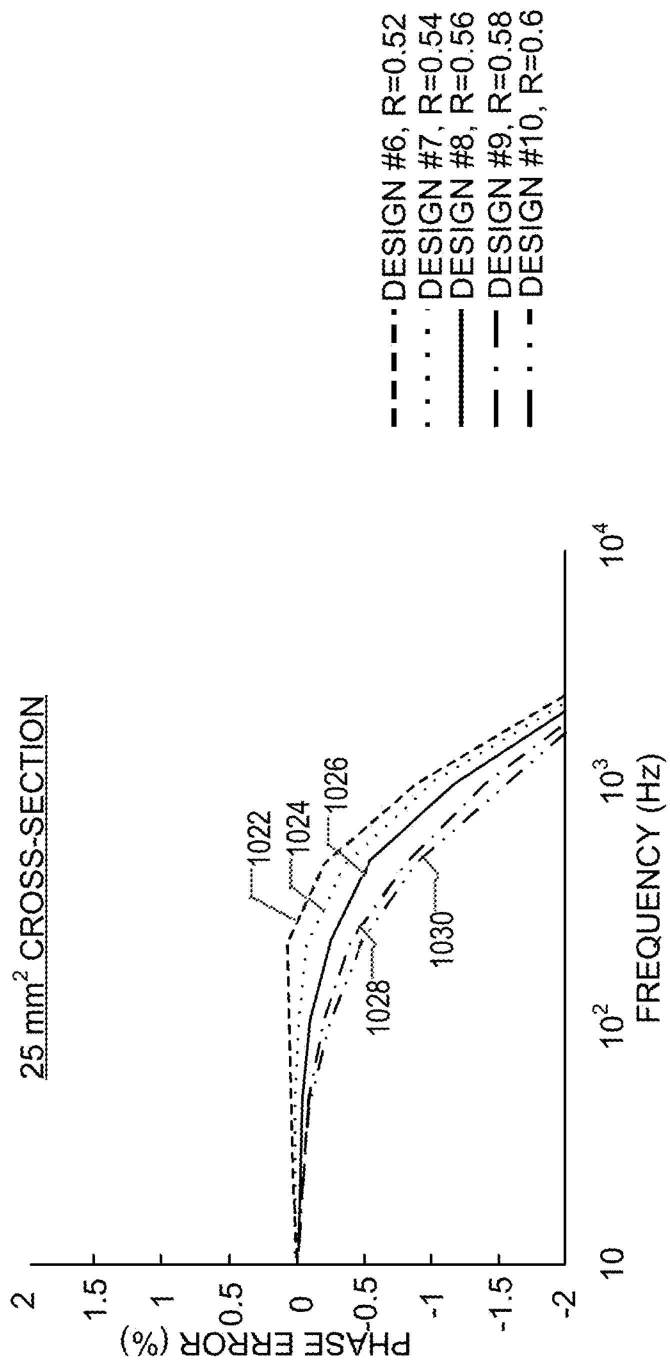
FIG. 10 is a graph illustrating aspects of the performance of the second set of system designs, according to aspects of the disclosure.

FIG. 10 shows curves 1022-1030, which illustrate the respective phase error for each of Designs 6-10. Curve 1022 represents the phase error for Design 6, and it shows that Design 6 may have a phase error of −1.7° at 2 kHz. Curve 1024 represents the phase error for Design 7, and it shows that Design 7 may have a phase error of −1.8° at 2 kHz. Curve 1026 represents the phase error for Design 8, and it shows that Design 8 may have a phase error of −2.0° at 2 kHz. Curve 1028 represents the phase error for Design 9, and it shows that Design 9 may have a phase error of −2.1° at 2 kHz. Curve 1030 represents the phase error for Design 10, and it shows that Design 10 may have a phase error of −2.2° at 2 kHz. Curves 1022-1030 were generated by simulating Designs 6-10 with the Ansys Maxwell™ electromagnetic simulation software. The simulations modeled the magnetic fields generated when 600 A of electrical current flows through the conductor 430.

FIGS. 9-11 illustrate that a large change in the frequency response of conductor 430 may result from a small change in its dimensions and/or manufacturing tolerances. For instance, in the example of FIGS. 9-11, a shift from +1% to −1% gain error can results from a 130 μm change in the widths $W_{C1}$ and $W_{C2}$ and a 270 μm change in the width $W_{C3}$.

Figure 12:
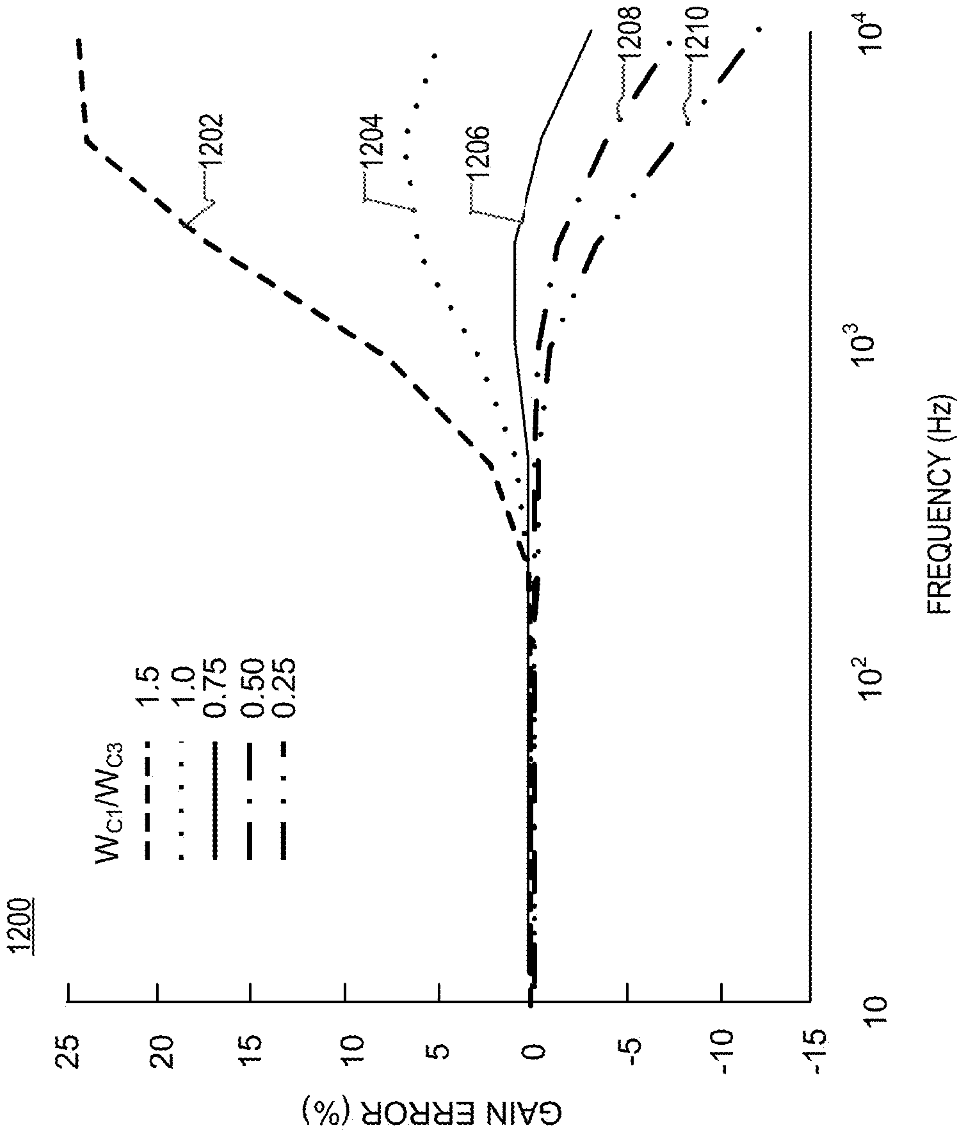
FIG. 12 is a graph illustrating aspects of the performance of a third set of system designs.

FIG. 12 shows a graph 1200 which includes gain error curves 1202-1210, according to the present disclosure. Curve 1202 corresponds to a design of conductor 430 that has a first characteristic ratio R of 1.5; curve 1204 corresponds to a design of conductor 430 that has a first characteristic ratio R of 1.0; curve 1206 corresponds to a design of conductor 430 that has a first characteristic ratio R of 0.75; curve 1208 corresponds to a design of conductor 430 that has a first characteristic ratio R of 0.5; and curve 1210 corresponds to a design of conductor 430 that has a first characteristic ratio R of 0.25. FIG. 12 is provided for illustrative purposes only. In the example of FIG. 12 the value of the widths $W_{C1}$ and $W_{C2}$ may be anywhere in the range of 0.5-5 mm, the thickness of the conductor 430 may be anywhere in the range 1-5 mm, and the magnitude of the electrical current through the bus bar may be anywhere in the range 100-3000 A. FIG. 12 is provided to illustrate that, according to the present disclosure, it has been determined that designs of conductor 430 whose first characteristic ratio R is in the range of 0.45-0.60 have a superior gain error performance, which makes such designs suitable for use in traction inverter applications.

Each of Designs 1-10, which are discussed below can be quantified by a second characteristic ratio RR, which is defined by equation 4 below.

$$RR = \frac{(W_{C1} + W_{C2})/2}{W_{C3}} \tag{4}$$

Figure 13:
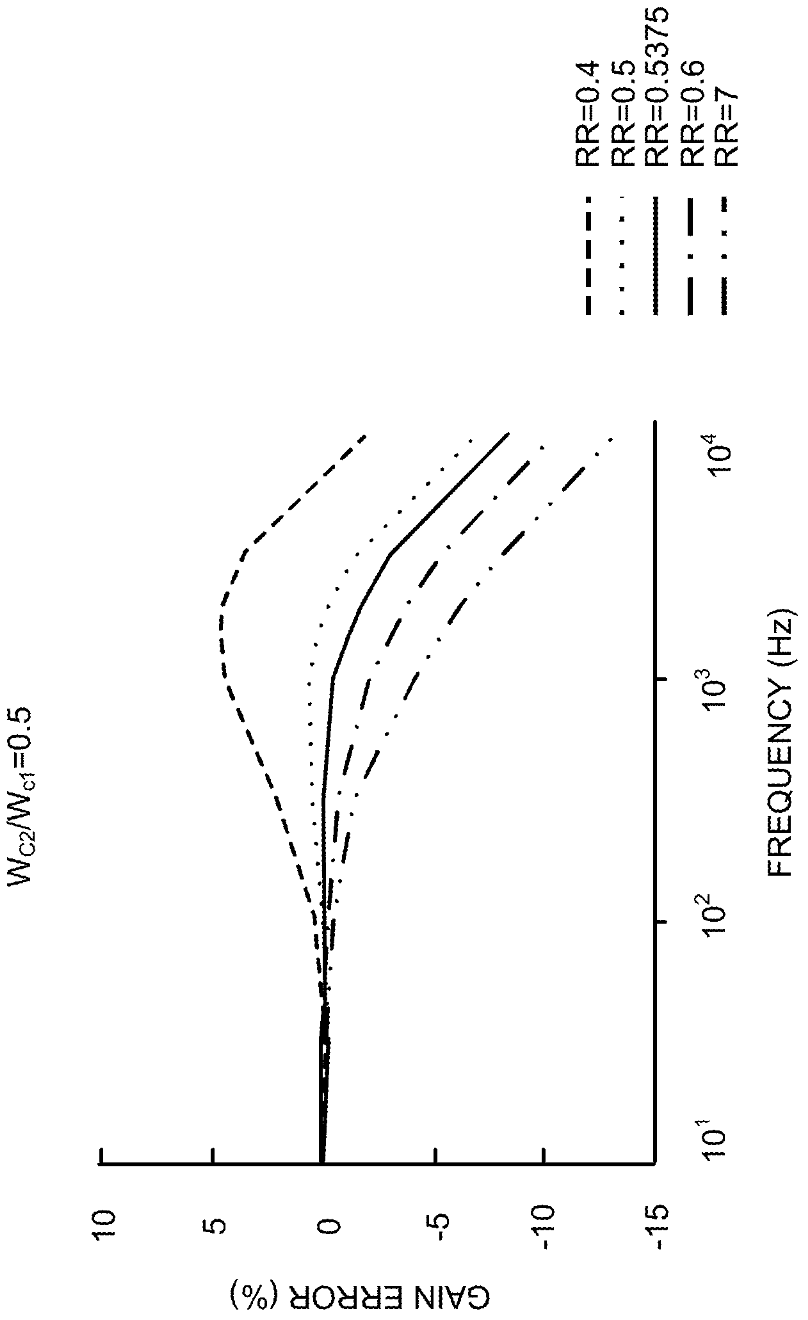
FIG. 13 is a graph illustrating the gain error of a set of conductor designs, according to aspects of the disclosure.
Figure 14:
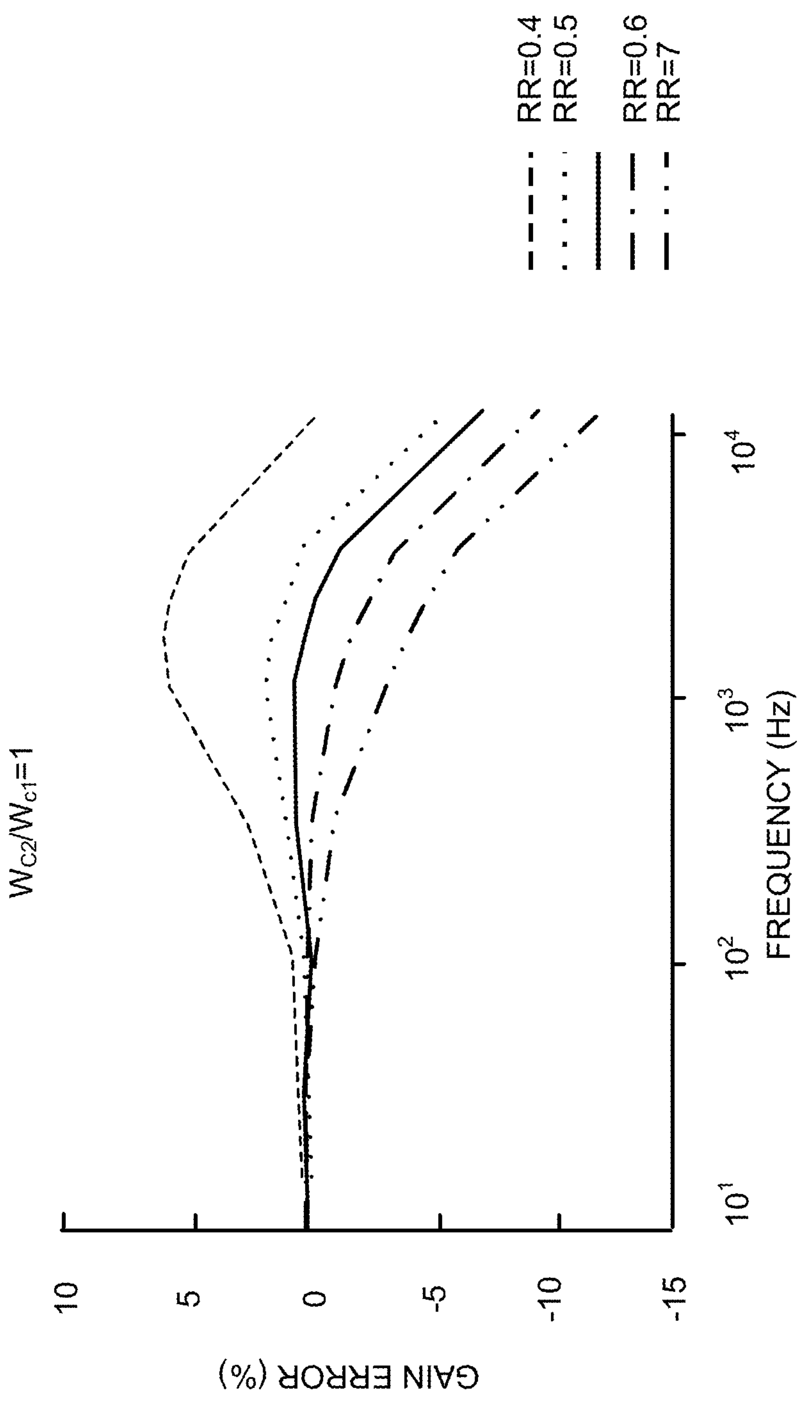
FIG. 14 is a graph illustrating the gain error of a set of conductor designs, according to aspects of the disclosure.
Figure 15:
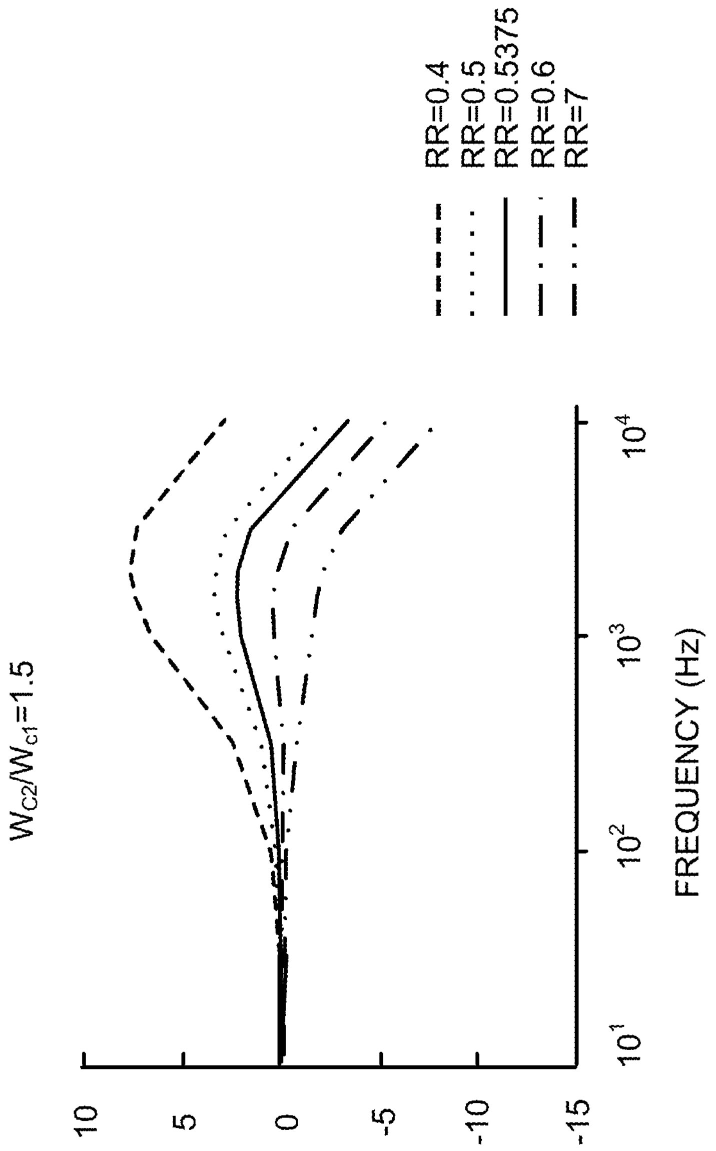
FIG. 15 is a graph illustrating the gain error of a set of conductor designs, according to aspects of the disclosure.

In the examples discussed with respect to FIGS. 4A-11, each of Designs 1-10 has the same value for $W_{C1}$ as the value for $W_{C2}$. In other words, the legs 411 and 412 in each of designs 1-10 have the same width. However, alternative implementations are possible in which, in any of Designs 1-10, the legs 411 and 412 have different widths, for as long as the second characteristic ratio RR of the design remains the same as in Table. 1. In other words, in any of Designs 1-10, the width $W_{C1}$ of leg 411 may be increased by X % for as long as the width $W_{C2}$ of leg 412 is decreased by the same amount (i.e., decreased by X %). Furthermore, in any of Designs 1-10, the width $W_{C1}$ of leg 411 may be decreased by X % for as long as the width $W_{C2}$ of leg 412 is increased by the same amount (i.e., increased by X %). In this case, the preferred ratio RR value for flat frequency response will shift slightly. As the ratio $W_{C2}/W_{C1}$ increases, the preferred ratio RR also increases, as shown in FIGS. 13-15. For example, in the below case, a preferred characteristic ratio RR=0.5375 was found when $W_{C2}=W_{C1}$ ($W_{C2}/W_{C1}=1.0$). When the ratio $WC/W_{C1}$ was decreased to 0.5, the preferred RR also decreased to about 0.5. When the $W_{C2}/W_{C1}$ ratio was increased to 1.5, the preferred RR also increased to about 0.6. The nominal case of RR=0.5375 in the plots below corresponds to a busbar with the dimensions shown in FIG. 5D.

In another aspect, FIG. 14 shows the values of the gain error for a set of baseline busbar designs in which the value of $W_{C1}$ is equal to the value of the $W_{C2}$. FIG. 13 shows the gain error values that result when, in each of the designs of FIG. 14, the value of $W_{C2}$ is decreased by 33% and the value of $W_{C1}$ is increased by 33% (while all other dimensions of the design are kept the same). FIG. 15 shows the gain error values when, in each of the designs, the value of $W_{C2}$ is increased by 20% and the value of $W_{C1}$ is decreased by 20% (while all other dimensions of the design are kept the same). Together, FIGS. 13-15 show that changing the relative widths of legs 441 and 442 (shown in FIG. 5C) has only a limited effect on the performance of a busbar design, provided that the same characteristic ratio RR is maintained. The values of the characteristic ratio RR for each of the designs of FIGS. 13-15 are provided in the legends to FIGS. 13-15. The curves of FIGS. 13-15 were generated by simulating the designs with the Ansys Maxwell™ electromagnetic simulation software.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

As used throughout the disclosure, the phrase "substantially equal" shall mean "within +/−10% of being exactly equal". As used throughout the disclosure, the phrase "substantially perpendicular" shall mean "within +/−10 degrees of being exactly perpendicular". As used throughout the disclosure, the phrase "substantially parallel" shall mean "within +/−10 degrees of being exactly parallel".

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). Although in the example of FIGS. 2-3, sensor 200 is implemented using Hall plates, it will be understood that the present disclosure is not limited to using any specific type of current sensor and/or any specific type of magnetic field sensing element in the current sensor.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A system comprising:

a conductor having a first through-hole and a second through-hole formed therein, the first and second through-holes being arranged to define a first leg, a second leg, and a third leg of the conductor, the first leg having a first width, the second leg having a second width that is substantially equal to the first width, and the third leg having a third width, the second leg being disposed between the first through-hole and the second through-hole, the first leg being disposed across the first through-hole from the second leg, and the third leg being disposed across the second through-hole from the second leg; and a current sensor that is disposed in the first through-hole, the current sensor being arranged to measure a level of electrical current through the conductor, wherein a ratio between the first width and the third width is in the range of 0.45-0.60.

2. The system of claim 1, wherein the first through-hole has a greater width than the second through-hole.

3. The system of claim 1, wherein the current sensor includes a first Hall element and a second Hall element, the first and second Hall elements being disposed on an axis that is substantially perpendicular to the first leg and the second leg.

4. The system of claim 1, wherein the third width is greater than the first width.

5. The system of claim 1, wherein the conductor includes a notch that is formed adjacent to the first through-hole, the first leg being defined by the notch and the first through-hole.

6. The system of claim 1, wherein the conductor includes a notch that is formed adjacent to the second through-hole, the third leg defined by the notch and the second through-hole.

7. The system of claim 1, wherein:

the conductor includes a first notch that is formed adjacent to the first through-hole, the first leg being defined by the first notch and the first through-hole; and the conductor includes a second notch that is formed adjacent to the second through-hole, the third leg being defined by the second notch and the second through-hole.

8. The system of claim 1, wherein the current sensor includes one or more magnetic field sensing elements, the one or more magnetic field sensing elements being disposed inside the first through-hole.

9. The system of claim 1, wherein the current sensor includes one or more magnetic field sensing elements, the one or more magnetic field sensing elements being disposed above or below the conductor.

10. The system of claim 1, wherein the second through-hole has a greater width than the first through-hole.

11. The system of claim 1, wherein the ratio is the range of 0.51-0.59.

12. The system of claim 1, wherein the ratio is defined in accordance with the equation of $R=W_{C1}/W_{C3}$, where R is the ratio, $W_{C1}$ is the first width, and $W_{C3}$ is the second width.

13. A system comprising:

a conductor having a first through-hole and a second through-hole formed therein, the first and second through-holes being arranged to define a first leg, a second leg, and a third leg of the conductor, the first leg having a first width, the second leg having a second width, and the third leg having a third width, the second leg being disposed between the first through-hole and the second through-hole, the first leg being disposed across the first through-hole from the second leg, and the third leg being disposed across the second through-hole from the second leg; and a current sensor that is disposed in the first through-hole, the current sensor being arranged to measure a level of electrical current through the conductor, wherein a ratio between an average of the first and second widths and the third width is in the range of 0.35-0.70.

14. The system of claim 13, wherein the first through-hole has a greater width than the second through-hole.

15. The system of claim 13, wherein the first width is substantially equal to the second width.

16. The system of claim 13, wherein the current sensor includes a first Hall element and a second Hall element, the first and second Hall elements being disposed on an axis that is substantially perpendicular to the first leg and the second leg.

17. The system of claim 13, wherein the third width is greater than the first width.

18. The system of claim 13, wherein the conductor includes a notch that is formed adjacent to the first through-hole, the first leg being defined by the notch and the first through-hole.

19. The system of claim 13, wherein the conductor includes a notch that is formed adjacent to the second through-hole, the third leg being defined by the notch and the second through through-hole.

20. The system of claim 13, wherein:

the conductor includes a first notch that is formed adjacent to the first through-hole, the first leg being defined by the first notch and the first through-hole; and the conductor includes a second notch that is formed adjacent to the second through-hole, the third leg being defined by the second notch and the second through-hole.

21. The system of claim 13, wherein the current sensor includes one or more magnetic field sensing elements, the one or more magnetic field sensing elements being disposed inside the first through-hole.

22. The system of claim 13, wherein the current sensor includes one or more magnetic field sensing elements, the one or more magnetic field sensing elements being disposed above or below the conductor.

23. The system of claim 13, wherein the second through-hole has a greater width than the first through-hole.

24. The system of claim 13, wherein the ratio is the range of 0.45-0.60.

25. The system of claim 13, wherein the ratio is defined in accordance with the equation of $RR=((W_{C1}+W_{C2})/2)/W_{C3}$, where RR is the ratio, $W_{C1}$ is the first width, $W_{C2}$ is the second width, and $W_{C3}$ is the third width.

26. An electrical conductor for use in power supply applications, the electrical conductor comprising:

a first through-hole formed therein;

a second through-hole formed therein;

a first leg having a first width;

a second leg having a second width that is substantially equal to the first width; and a third leg having a third width, wherein the second leg is disposed between the first through-hole and the second through-hole, the first leg is disposed across the first through-hole from the second leg, and the third leg is disposed across the second through-hole from the second leg, and wherein a ratio between the first width and the third width is in the range of 0.45-0.60.

27. The electrical conductor of claim 26, wherein the first through-hole has a greater width than the second through-hole.

28. The electrical conductor of claim 26, further comprising at least one of (i) a first notch that is formed adjacent to the first through-hole, the first leg being defined by the first notch and the first through-hole, and (ii) a second notch that is formed adjacent to the second through-hole, the third leg being defined by the second notch and the second through-hole.

29. The electrical conductor of claim 26, wherein the ratio is the range of 0.51-0.59.

30. The electrical conductor of claim 26, wherein the ratio is defined in accordance with the equation of $R=W_{C1}/W_{C3}$, where R is the ratio, $W_{C1}$ is the first width, and $W_{C3}$ is the third width.

31. An electrical conductor for use in power supply applications, the electrical conductor comprising:

a first through-hole formed therein;

a second through-hole formed therein;

a first leg having a first width;

a second leg having a second width; and a third leg having a third width, wherein the second leg is disposed between the first through-hole and the second through-hole, the first leg is disposed across the first through-hole from the second leg, and the third leg is disposed across the second through-hole from the second leg, and wherein a ratio between an average of the first and second widths and the third width is in the range of 0.35-0.70.

32. The electrical conductor of claim 26, wherein the first through-hole has a greater width than the second through-hole.

33. The electrical conductor of claim 26, further comprising at least one of (i) a first notch that is formed adjacent to the first through-hole, the first leg being defined by the first notch and the first through-hole, and (ii) a second notch that is formed adjacent to the second through-hole, the third leg being defined by the second notch and the second through-hole.

34. The electrical conductor of claim 26, wherein the ratio is the range of 0.45-0.60.

35. The electrical conductor of claim 26, wherein the ratio is defined in accordance with the equation of $RR=((W_{C1}+W_{C2})/2)/W_{C3}$, where RR is the ratio, $W_{C1}$ is the first width, $W_{C2}$ is the second width, and $W_{C3}$ is the third width.

* * * * *